(12) United States Patent
Choi et al.

(10) Patent No.: US 7,659,531 B2
(45) Date of Patent: Feb. 9, 2010

(54) OPTICAL COUPLER PACKAGE

(75) Inventors: Yoon Hwa Choi, Kyonggido (KR); Yong Suk Kwon, Suzhou (KR); Maria Clemens Y. Quinones, Cebu (PH)

(73) Assignee: Fairchild Semiconductor Corporation, South Portland, ME (US)

( * ) Notice: Subject to any disclaimer, the term of this patent is extended or adjusted under 35 U.S.C. 154(b) by 53 days.

(21) Appl. No.: 11/735,257

(22) Filed: Apr. 13, 2007

(65) Prior Publication Data
US 2008/0251739 A1    Oct. 16, 2008

(51) Int. Cl.
G02B 27/00 (2006.01)
(52) U.S. Cl. .................. 250/551; 250/239; 257/80; 257/81; 257/82
(58) Field of Classification Search ............. 250/551, 250/239; 257/80–82
See application file for complete search history.

(56) References Cited

U.S. PATENT DOCUMENTS

| | | |
|---|---|---|
| 3,956,821 A | 5/1976 | Martin |
| 4,058,899 A | 11/1977 | Phy |
| 4,680,613 A | 7/1987 | Daniels et al. |
| 4,720,396 A | 1/1988 | Wood |
| 4,731,701 A | 3/1988 | Kuo et al. |
| 4,751,199 A | 6/1988 | Phy |
| 4,772,935 A | 9/1988 | Lawler et al. |
| 4,791,473 A | 12/1988 | Phy |
| 4,796,080 A | 1/1989 | Phy |
| 4,839,717 A | 6/1989 | Phy et al. |
| 4,890,153 A | 12/1989 | Wu |
| 5,327,325 A | 7/1994 | Nicewarner, Jr. |
| 5,340,993 A * | 8/1994 | Salina et al. ............... 250/551 |
| 5,389,578 A * | 2/1995 | Hodson et al. ............... 438/25 |
| 5,646,446 A | 7/1997 | Nicewarner, Jr. et al. |
| 5,753,929 A * | 5/1998 | Bliss ............................ 250/551 |
| 5,776,797 A | 7/1998 | Nicewarner, Jr. et al. |
| 6,133,634 A | 10/2000 | Joshi |
| 6,309,916 B1 * | 10/2001 | Crowley et al. ............. 438/127 |
| 6,329,706 B1 | 12/2001 | Nam |
| 6,388,264 B1 * | 5/2002 | Pace ............................ 250/551 |
| 6,424,035 B1 | 7/2002 | Sapp et al. |
| 6,432,750 B2 | 8/2002 | Jeon et al. |
| 6,449,174 B1 | 9/2002 | Elbanhawy |
| 6,489,678 B1 | 12/2002 | Joshi |
| 6,556,750 B2 | 4/2003 | Constantino et al. |
| 6,566,749 B1 | 5/2003 | Joshi et al. |
| 6,574,107 B2 | 6/2003 | Jeon et al. |
| 6,621,152 B2 | 9/2003 | Choi et al. |
| 6,627,991 B1 | 9/2003 | Joshi |
| 6,633,030 B2 | 10/2003 | Joshi |
| 6,642,738 B2 | 11/2003 | Elbanhawy |
| 6,645,791 B2 | 11/2003 | Noquil et al. |
| 6,674,157 B2 | 1/2004 | Lang |
| 6,683,375 B2 | 1/2004 | Joshi et al. |
| 6,696,321 B2 | 2/2004 | Joshi |

(Continued)

*Primary Examiner*—Georgia Y Epps
*Assistant Examiner*—Kevin Wyatt
(74) *Attorney, Agent, or Firm*—Townsend and Townsend and Crew LLP

(57) ABSTRACT

A method is disclosed. The method includes forming a substrate with a leadframe and a molding compound. The molding compound fills internal spaces in the leadframe and forms a dam structure. An optical emitter and an optical receiver are placed on the substrate. An optically transmissive medium is formed between the optical emitter and optical receiver.

24 Claims, 11 Drawing Sheets

U.S. PATENT DOCUMENTS

| | | |
|---|---|---|
| 6,720,642 B1 | 4/2004 | Joshi et al. |
| 6,731,003 B2 | 5/2004 | Joshi et al. |
| 6,740,541 B2 | 5/2004 | Rajeev |
| 6,756,689 B2 | 6/2004 | Nam et al. |
| 6,774,465 B2 | 8/2004 | Lee et al. |
| 6,777,800 B2 | 8/2004 | Madrid et al. |
| 6,806,580 B2 | 10/2004 | Joshi et al. |
| 6,830,959 B2 | 12/2004 | Estacio |
| 6,836,023 B2 | 12/2004 | Joshi et al. |
| 6,867,481 B2 | 3/2005 | Joshi et al. |
| 6,867,489 B1 | 3/2005 | Estacio |
| 6,891,256 B2 | 5/2005 | Joshi et al. |
| 6,891,257 B2 | 5/2005 | Chong et al. |
| 6,893,901 B2 | 5/2005 | Madrid |
| 6,943,434 B2 | 9/2005 | Tangpuz et al. |
| 6,989,588 B2 | 1/2006 | Quinones et al. |
| 6,992,384 B2 | 1/2006 | Joshi |
| 7,022,548 B2 | 4/2006 | Joshi et al. |
| 7,023,077 B2 | 4/2006 | Madrid |
| 7,061,077 B2 | 6/2006 | Joshi |
| 7,061,080 B2 | 6/2006 | Jeun et al. |
| 7,081,666 B2 | 7/2006 | Joshi et al. |
| 7,122,884 B2 | 10/2006 | Cabahug et al. |
| 7,154,168 B2 | 12/2006 | Joshi et al. |
| 7,157,799 B2 | 1/2007 | Noquil et al. |
| 7,196,313 B2 | 3/2007 | Quinines et al. |
| 7,199,461 B2 | 4/2007 | Son et al. |
| 7,208,819 B2 | 4/2007 | Jeun et al. |
| 7,215,011 B2 | 5/2007 | Joshi et al. |
| 7,217,594 B2 | 5/2007 | Manatad |
| 7,242,076 B2 | 7/2007 | Dolan |
| 7,256,479 B2 | 8/2007 | Noquil et al. |
| 7,268,414 B2 | 9/2007 | Choi et al. |
| 7,271,497 B2 | 9/2007 | Joshi et al. |
| 2005/0207697 A1* | 9/2005 | Kek et al. ............... 385/15 |
| 2005/0218300 A1* | 10/2005 | Quinones et al. ........ 250/214 R |

* cited by examiner

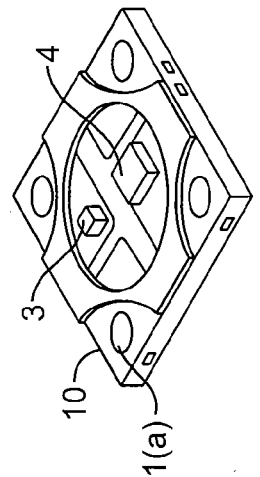
FIG. 4(a)
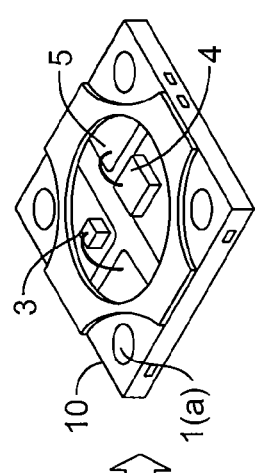
FIG. 4(b)
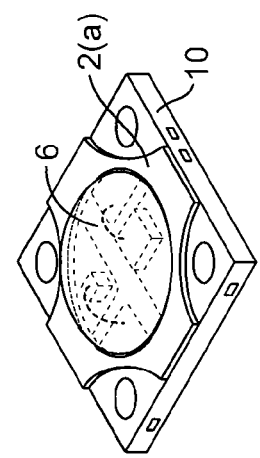
FIG. 4(c)
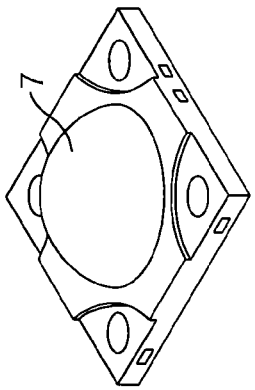
FIG. 4(d)
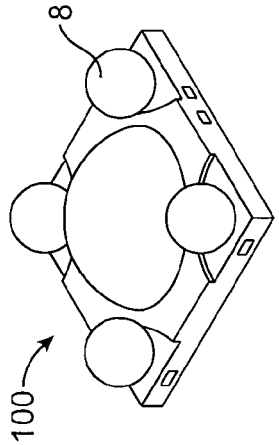
FIG. 4(e)
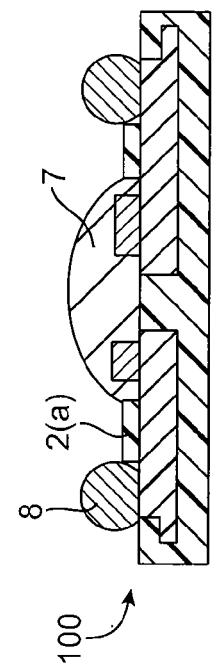
FIG. 4(f)

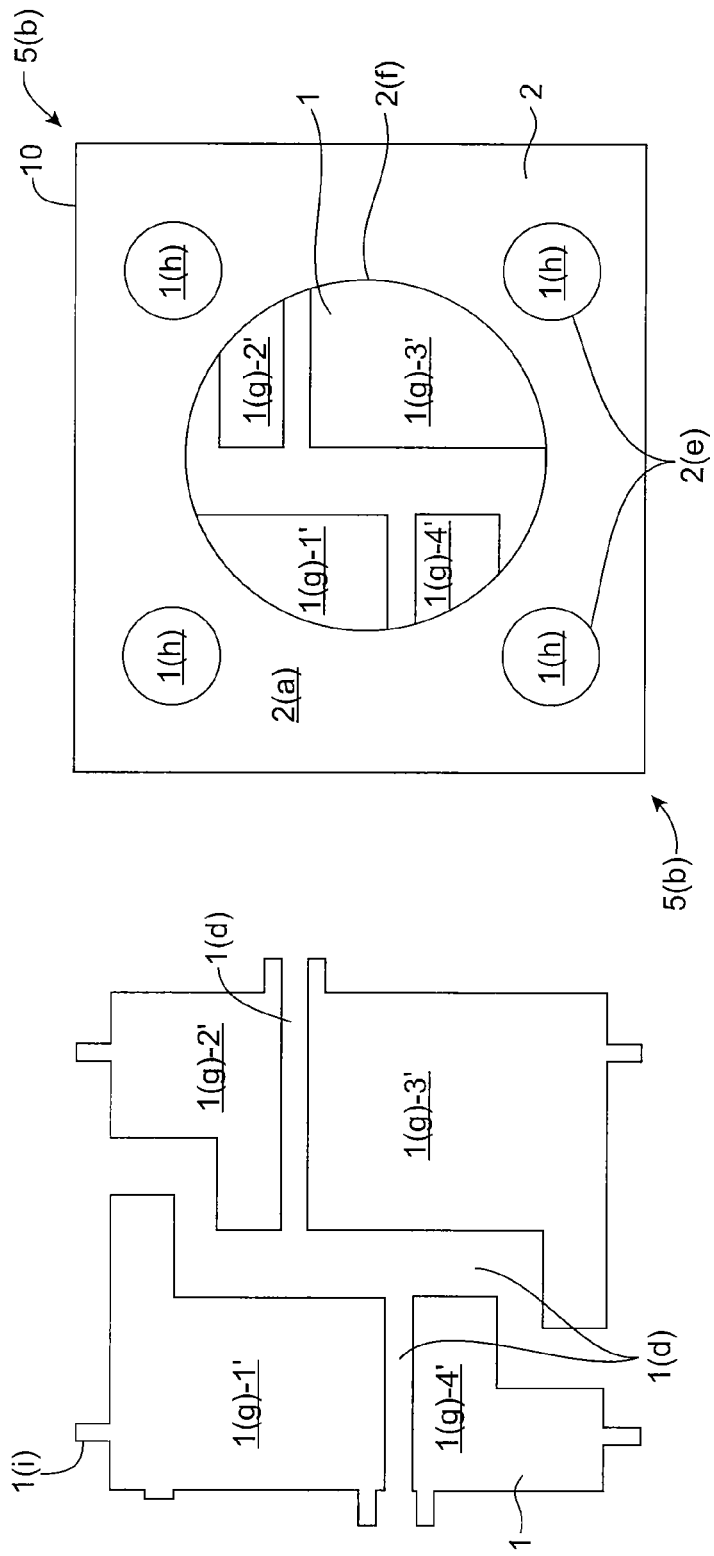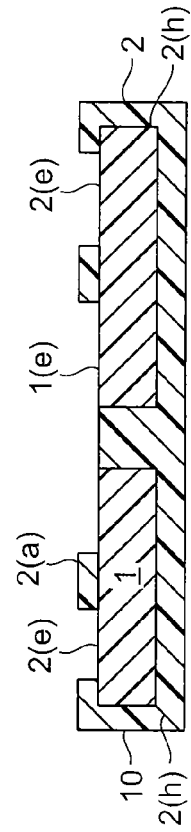

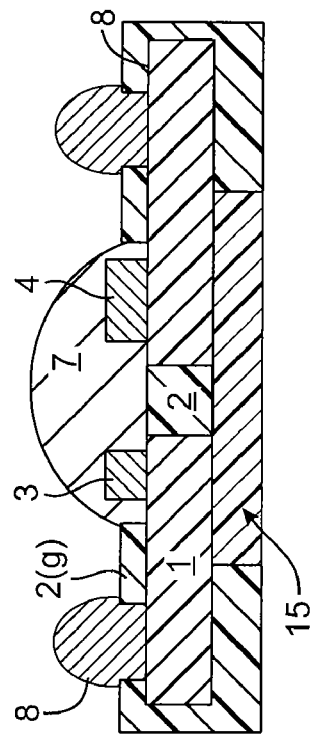
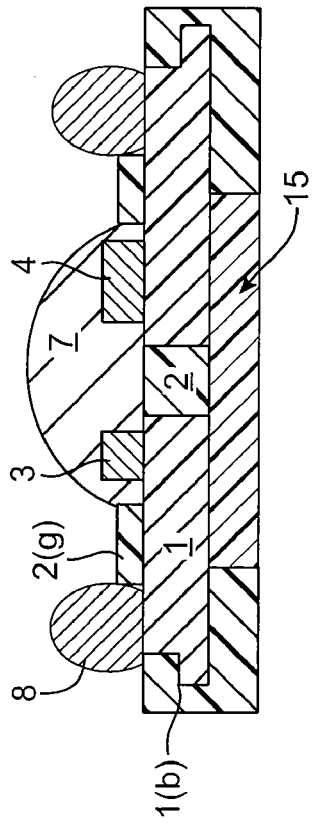

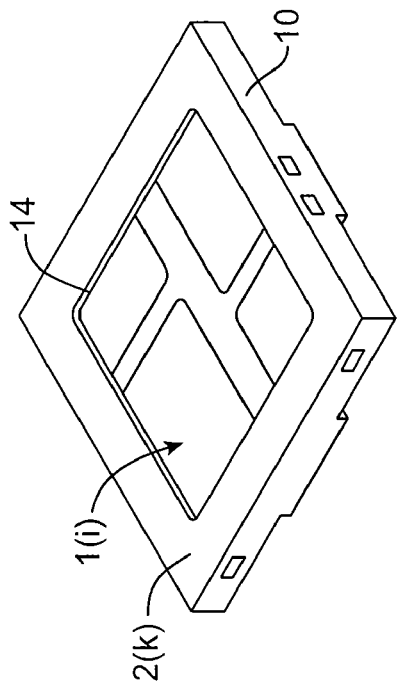
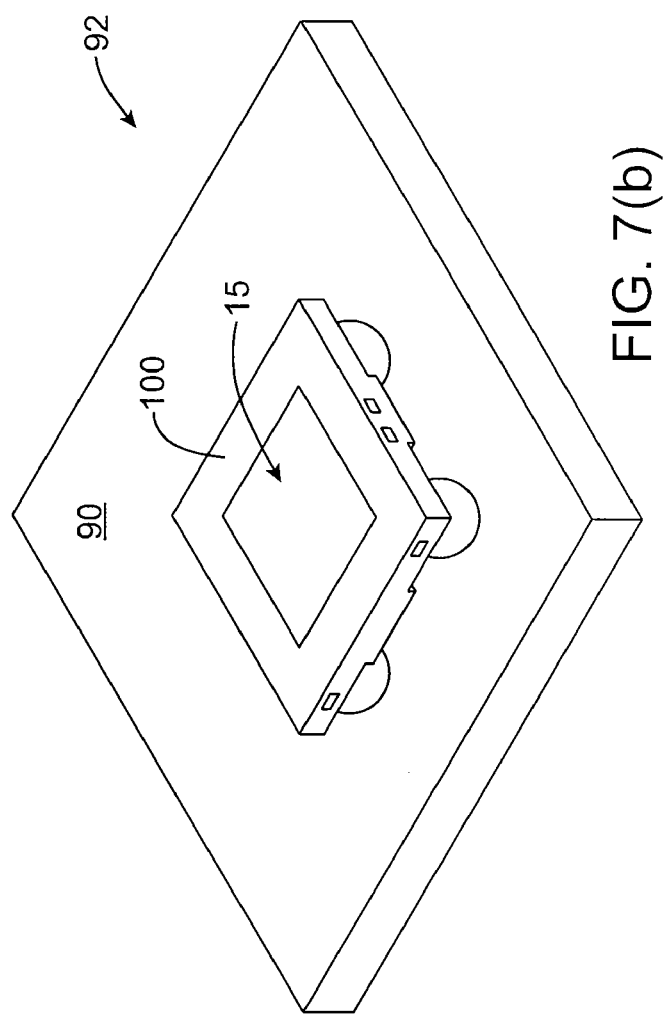

OPTICAL COUPLER PACKAGE

CROSS-REFERENCES TO RELATED APPLICATIONS

Not Applicable

BACKGROUND OF THE INVENTION

Optical coupler packages contain at least one optical emitter device which is optically coupled to an optical receiver device through an optically transmissive medium. This arrangement permits the passage of information from one electrical circuit that contains the optical emitter device to another electrical circuit that contains the optical receiver device. A high degree of electrical isolation is maintained between the two circuits. Because information is passed optically across an insulating gap, the transfer is one way. For example, the optical receiver device cannot modify the operation of a circuit containing the optical emitter device. This feature is important because, for example, the emitter may be driven by a low voltage circuit using a microprocessor or logic gates, while the output optical receiver device may be part of a high voltage DC or AC load circuit. The optical isolation also prevents damage to the input circuit caused by the relatively hostile output circuit.

A common optical coupler package format is the dual-in-line package or DIP. This package is widely used to house integrated circuits and is also used for conventional optical couplers. Various versions of optical coupler DIP packages having 4, 6, 8 or 16 pins are commonly manufactured.

An improved optical coupler package is shown in FIG. 1(a). FIG. 1(a) shows a perspective view of an optical coupler package 900. It includes a substrate 902 and a "glob top" 906 comprising a light transmissive material. The glob top 906 covers the above-described optical emitter device and optical receiver device to protect them from the external environment. Solder balls 904 are on the substrate 902 and surround the glob top 906. In use, the optical coupler package 900 is flipped over and mounted to a circuit board or the like.

Although the package 900 shown in FIG. 1(a) is effective, as shown by the intermediate package structure 901 in FIG. 1(a), one problem that can occur during manufacturing is that the glob top 906 can overflow towards the pads 905 upon which the solder balls 904 (in FIG. 1(b)) would be located. The glob top 906 is generally deposited in a liquid or semi-solid form onto the substrate 902 and is cured. The uncured glob top 906 can flow before it is cured and can overflow onto the pads 905. If this occurs, then it may not be possible to place the solder balls 904 on the pads 905 and rework of the intermediate package structure 901 may be needed.

It is possible to separately deposit a dam structure on the substrate 902 to confine the glob top 906 as it is being formed. However, this requires additional process steps and adds to the overall cost of the package that is eventually formed. Also, the dam would only prevent the overflow of the glob top 906 as it is being formed. It would not serve any other function.

Embodiments of the invention address these and other problems, individually and collectively.

BRIEF SUMMARY

Embodiments of the invention are directed to optical coupler packages and methods for forming the same.

One embodiment of the invention is directed to a method. The method includes forming a substrate with a leadframe and a molding compound. The molding compound fills internal spaces in the leadframe and forms a dam structure. An optical emitter and an optical receiver are mounted on the substrate. An optically transmissive medium is formed between the optical emitter and optical receiver.

Another embodiment of the invention is directed to an optical coupler package comprising a substrate comprising a leadframe and a molding compound. The molding compound fills gaps in the leadframe and forms a dam structure. The dam structure is integral with at least a portion of the molding compound that fills the gaps in the leadframe. An optical emitter device and an optical receiver device are on the substrate. An optically transmissive medium is disposed between the optical emitter and optical receiver.

Another embodiment of the invention is directed to an optical coupler package comprising a substrate comprising a leadframe and a molding compound, wherein the molding compound fills gaps in the leadframe, and a dam structure defining a device mounting area. An optical emitter device and an optical receiver device are on the substrate. An optically transmissive medium is disposed between the optical emitter and optical receiver, and a plurality of conductive structures are on the substrate. The conductive structures contact the dam structure.

These and other embodiments of the invention are described in further detail below.

BRIEF DESCRIPTION OF THE DRAWINGS

FIGS. 4(a)-4(e) show perspective views of an optical coupler package as it is being formed.

FIG. 4(f) shows a side-cross sectional view of the optical coupler package shown in FIG. 4(e).

FIG. 5(a) shows a top plan view of a leadframe.

FIG. 5(b) show a top view of a premolded substrate.

FIG. 5(c) shows a side, cross-sectional view of the premolded substrate shown in FIG. 5(b).

FIGS. 6(a)-6(e) show side, cross-sectional views of other optical coupler package embodiments.

FIG. 7(a) shows a bottom perspective view a premolded substrate.

FIG. 7(b) shows a bottom perspective view of an optical coupler package with the premolded substrate shown in FIG. 7(a), and mounted on a printed circuit board.

In the Figures, like numerals designate like elements, and the descriptions of some elements may not be repeated.

DETAILED DESCRIPTION

Embodiments of the invention are directed to optical coupler packages. Each optical coupler package can include an optical emitter device (e.g., a light emitting diode) and an optical receiver device (e.g., a photodiode). The optical emitter device and the optical receiver device can be mounted on a premolded substrate comprising a leadframe and a molding material, wirebonds are formed between the devices and the substrate, and then the optical emitter and receiver devices are covered with an optically transmissive coupling gel and an opaque, highly reflective epoxy based polymer.

Logic devices such as control chips can also be on the leadframe-based substrate and may also be in the optical coupler package. Also, chips including MOSFETs (metal oxide semiconductor field effect transistors) such as power MOSFETs with or without trenched gates may be on the substrate and in the package. Such chips or devices may be on the substrate and may be electrically coupled to components such as the optical emitter and optical receiver devices.

Figure 1B:
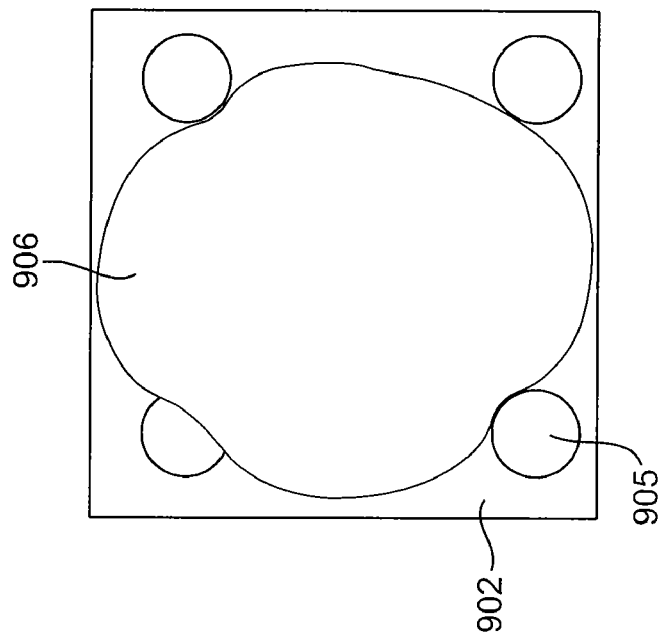
FIG. 1(b) shows an plan view of an intermediate optical coupler package structure with an overflowing glob top.
Figure 1A:
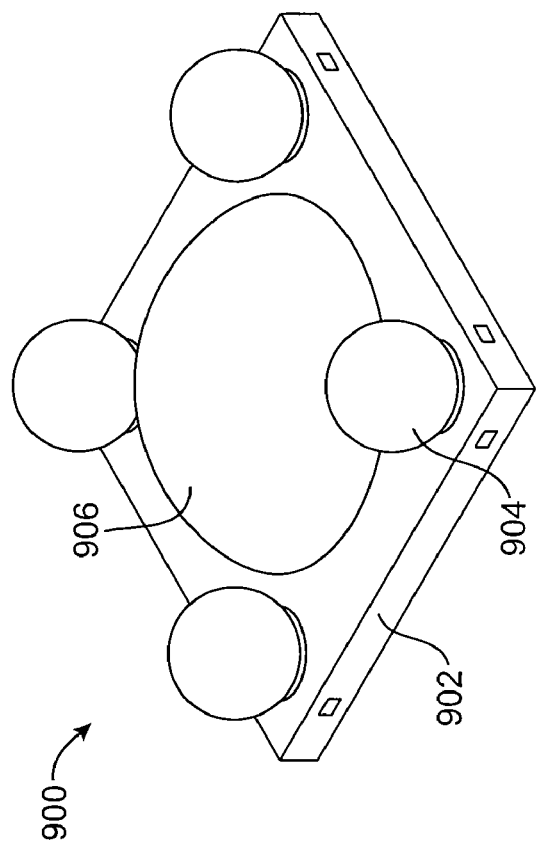
FIG. 1(a) shows a top perspective view of an optical coupler package.
Figure 2A:
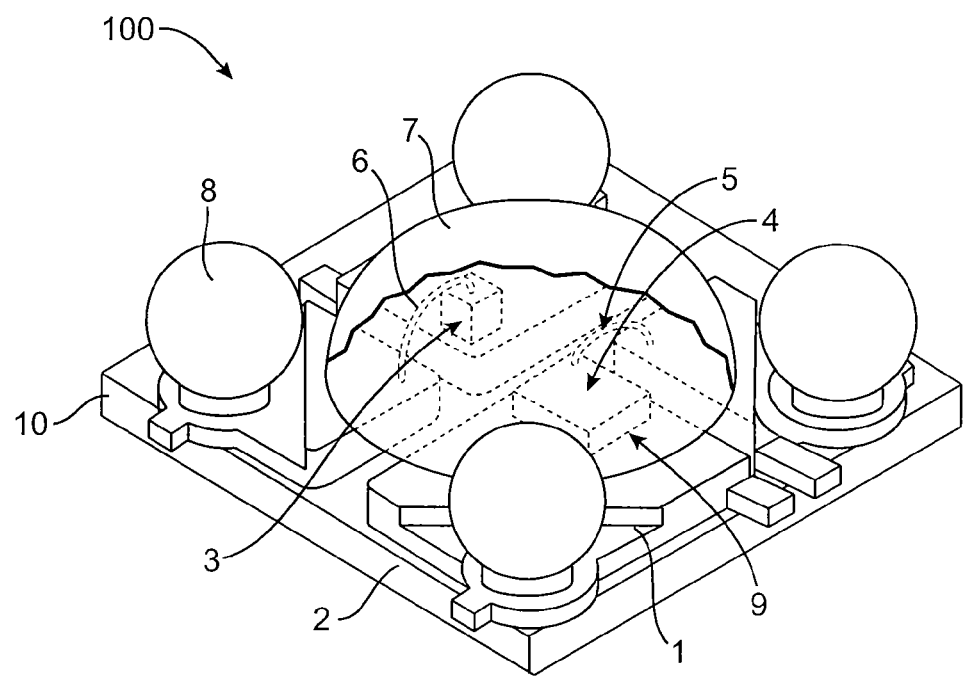
FIG. 2(a) shows a perspective view of an optical coupler package according to an embodiment of the invention, wherein the devices in the package are shown.

FIG. 2(a) shows an optical coupler package 100 according to an embodiment of the invention. For ease of reference, the view of the package 100 in FIG. 2(a) can be characterized as a top perspective view. The package 100 can eventually be flipped over and mounted to a circuit board (not shown) so that the illustrated portion of the package 100 may in fact be the bottom view when the package 100 is mounted to the circuit board.

The package 100 comprises a premolded premolded substrate 10. It comprises a leadframe 1 and a molding compound 2 coated on the leadframe 1. The leadframe 1 may include a die attach area where two or more devices including optical receiver and optical emitter devices are placed. Two or more leads may extend from the die attach area and may form terminals of a leadframe. The term "leadframe" includes leadframes that may or may not have been processed (e.g., by etching).

The leadframe 1 can comprise any suitable metal and may be of any suitable thickness. For example, a high mechanical strength copper alloy is preferred. The leadframe 1 can have a thickness of about 0.2 mm (8 mils) or less in the etched or non-etched areas. Etching processes are known to those of ordinary skill in the art. The leadframe 1 may also include plating layers such as Ni, Pd, Au or Ag, etc. In this example, the leadframe 1 is partially etched.

The molding compound 2 of the substrate 10 forms the body of the substrate 10. It fills in the various gaps and partially or half-etched regions of the leadframe 1. The molding compound 2 can comprise a polymeric and/or composite material that may or may not require post mold curing. It may contain epoxy resins, hardeners, elastomers, non-phosphorus flame retardants, lubes, silica fillers, etc. It may have balanced particle sizes in it to ensure complete filling of the half-etched regions of the leadframe 1. It may also contain a sufficient amount of carbon black pigment for better laser marking contrast. The materials making up the balance of the mold compound 2 constituent materials can be used to prevent substrate warpage.

Figures 2B, 2C:
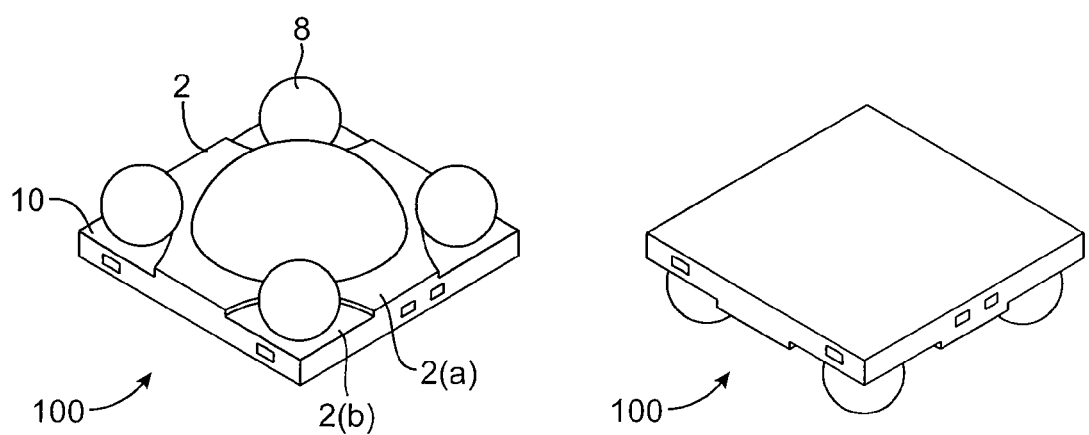
FIG. 2(b) shows a top perspective view of the optical coupler package shown in FIG. 2(a). The devices in the package are not shown.
FIG. 2(c) shows the package shown in FIG. 2(b), flipped over.

As shown in FIGS. 2(a)-2(c), the premolded substrate 10 may be a "two-sided overmolded" structure, since both the top side and bottom side of the leadframe 1 are covered with the molding compound 2.

An optical emitter 3 (e.g., an LED die made of AlGaAs) is mounted on the substrate 10. The optical emitter 3 generates photons when a forward current is applied to the optocoupler, resulting to light emissions from a P-N junction in the die 3. An LED die having a height of about 9 mils or below can be used.

An optical receiver device 4 (e.g., a silicon phototransistor) is also mounted on the substrate 10 in some cases. The optical receiver device 4 detects light emitted by the optical emitter device 3 and converts it to electrons resulting in current flow at the output of the optical coupler package 100. The optical receiver device 4 may have a height of about 8 mils or less in some embodiments A die attach material (not shown) can bond the backs of the optical emitter and optical receiver devices 3, 4 to their respective designated die attach pads on the substrate 10. The die attach material can be any conductive bonding material. Examples include Ag-filled epoxies, soft solders, etc.

Bonding wires 5 connect the terminals of the optical emitter and optical receiver devices 3, 4 to corresponding bond pads on the leadframe 1 in the substrate 10. The bonding wires 5 can comprise any suitable ductile metal—Au, Cu, Al, or doped versions of these metals, alloys of these metals, etc.

The wire bonded optical emitter and optical receiver device assemblies are coupled together using a light transmissive clear gel material 6 (e.g., silicone or a transparent epoxy). The optical transparency of the coupling gel 6 allows for the efficient transfer of the light emitted from the optical emitter 3 to the optical detector 4. The coupling gel 6 covers the entire wire bonded die assemblies and forms a near hemispherical dome for maximum transmission of emitted light.

The light transmissive hemispherical dome 6 on the wire bonded optical receiver device 3 and optical emitter device 4 may be covered with a white reflective coating 7 (e.g., a white epoxy glob top coating). The light reflective coating 7 keeps the emitted light within the confines of the dome. The coating 7 conforms to the dome shape and can totally cover the clear coupling gel 6 (or light transmissive material). It seals the dome by adhesion. The coating 7 can have a minimum thickness of about 0.2 mm in some embodiments of the invention.

As shown in FIG. 2(a), in the illustrated example, the optical coupler package 100 has four solder balls 8 located at the corners of the substrate 10. The solder balls may comprise any suitable material including a Pb—Sn alloy, or a lead-free solder such as SnAgCu or InSb. Although solder balls are described in detail, other conductive structures such as copper columns (e.g., preformed or electroplated) could be used instead. The conductive structures have heights greater than the heights of the optical receiver 4 and the optical emitter 3 in the package 100 so that flip chip mounting can take place.

FIGS. 2(a) and 2(b) show the package 100 in a "dead bug" position, while FIG. 2(c) shows the package in a "live bug" position as it would be mounted to a circuit board 102.

FIG. 2(b) shows the molding compound 2 including an exterior surface 2(b) which exposes a conductive pad (not shown) and is substantially coplanar with the conductive pad. In this example, there are four such surfaces 2(b) at the corners of the package 100, and they at least partially define a dam structure 2(a). The dam structure 2(a) surrounds mounting pads for the optical emitter device 3 and the optical receiver device 4, and confines the coupling gel 6 so that it does not flow to the pads upon which the solder balls 8 rest. The edges of the dam structure 2(a) support the solder balls 8 so that they anchor the solder balls 8 to the substrate 10. The molding compound 2 forming the dam structure 2(a) is integral with other portions of the molding compound 2 residing between gaps in the leadframe 1.

Figure 3B:
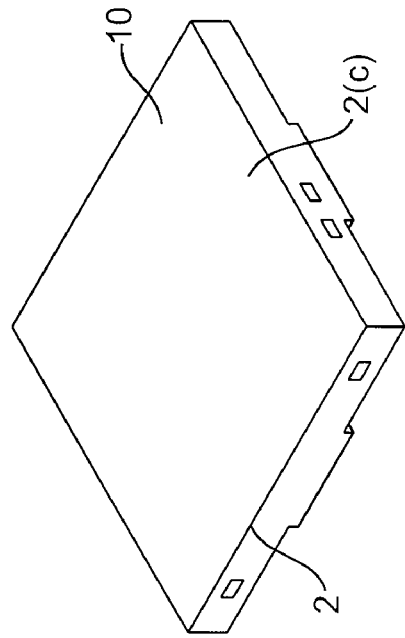
FIG. 3(b) shows a top side of a premolded substrate.
Figure 3C:
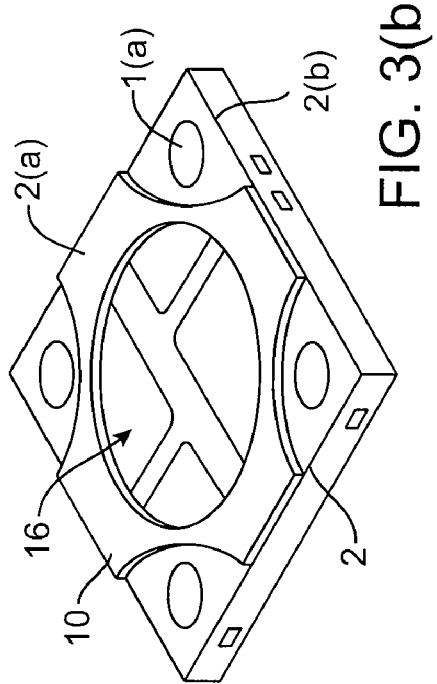
FIG. 3(c) shows a bottom side of a premolded substrate.
Figure 3A:
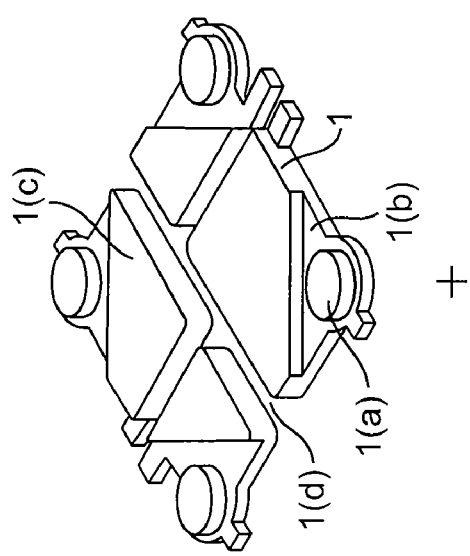
FIG. 3(a) shows a leadframe and a molding compound.

FIG. 3(a) shows a perspective view of an etched leadframe 1 and a molding compound 15 before it is molded. The etched leadframe 1 comprises an etched region 1(b) which defines conductive pads 1(a) for solder balls. Additional conductive pads 1(c) for devices and wirebonds are within the interior of the leadframe 1. Gaps 1(d) are present between distinct portions of the leadframe 1. In one example, the leadframe 1 may be 0.25 mm thick and may be an etched copper alloy leadframe that is plated with NiPdAu.

FIG. 3(b) shows a top perspective view of the substrate 10. As shown, the surface 2(b) of the molding compound 2 can be substantially coplanar with the surface of the conductive pad 1(a). In this example, there are four pads 1(a), one at each corner. The dam structure 2(a) can surround a device mounting region 16 where devices such as the previously described optical emitter device 3 and the optical receiver device 4 can be mounted. The dam structure 2(a) may be about 0.10 mm thick relative to the exterior surface 2(b), while the thickness of the substrate 10 may be on the order of about 0.45 mm thick. In this example, the dam structure 2(a) has a continuous inner edge that is circular. In other embodiments, the dam structure can be discontinuous.

FIG. 3(c) shows the bottom side of the substrate 10. The overmold thickness (i.e., the thickness of the molding compound on the leadframe 1 at the bottom side) on the bottom side of the substrate 10 may be about 0.10 mm or less in some embodiments.

Figure 9A:
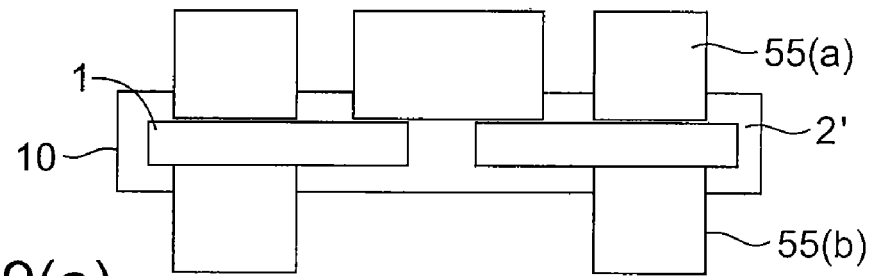
FIGS. 9(a)-9(c) show schematic illustrations of a molding process using a molding tool comprising two sets of molding dies.
Figure 9B:
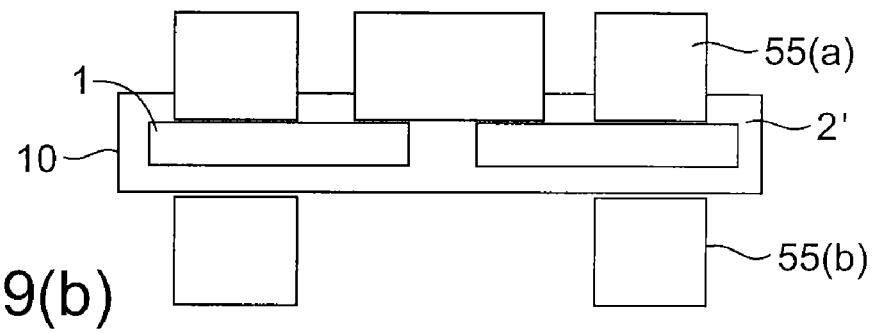
Figure 9C:
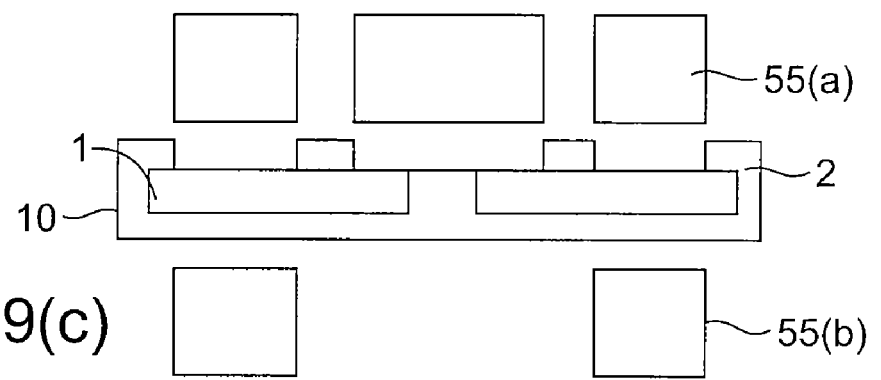

The substrate 10 may be formed using any suitable process. In preferred embodiments, a molding tool comprising two molding dies is used. FIGS. 9(a)-9(c) show schematic illustrations of a molding process using a molding tool comprising two sets of molding dies. A molding tool of this type may be used to form any of the premolded substrates described herein.

FIG. 9(a) shows an illustration of a set of molding dies 55(a), 55(b) clamping down on portions of a leadframe 1. A molding compound precursor 2' can be formed around the leadframe 1, and may be partially solidified. As shown in FIG. 9(b), after a period of time, one molding die 55(b) may be retracted, and the area where it previously clamped the leadframe 1 can be filled with molding compound 2. As shown in FIG. 9(c), after the molding compound 2 is fully cured, the other molding die 55(a) can be retracted so that the substrate 10 is formed.

FIGS. 4(a)-4(e) illustrate the process for forming an optical coupler package after the substrate 10 is formed.

Referring to FIG. 4(a), after obtaining the substrate 10, the optical emitter device 3 and the optical receiver device 4 can be mounted to conductive pads on the substrate 10. Any suitable adhesive (e.g., a conductive or non-conductive epoxy or solder) could be used to mount the optical emitter device 3 and the optical receiver device 4. If an epoxy is used, it can be cured.

Referring to FIG. 4(b), after the optical emitter device 3 and the optical receiver device 4 are mounted on the substrate 10, wirebonds 5 may be formed between the optical emitter device 3 and an adjacent conductive pad, and between the optical receiver device 4 and an adjacent conductive pad. A thermosonic or ultrasonic wire bonding process, or any other suitable wire bonding process can be used. Also, as an alternative to wirebonds, a conductive clip or the like can be used.

Referring to FIG. 4(c), a coupling gel 6 is deposited on the substrate 10. When it is deposited on the substrate 10, the coupling gel 6 is able to flow, but is confined to a predetermined location of the substrate 10 by the dam 2(a). After the coupling gel 6 is deposited, it can be cured.

Referring to FIG. 4(d), a glob top coating 7 is then formed on the coupling gel 6. The glob top coating 7 can be formed using any suitable coating and curing process.

Referring to FIG. 4(e), after forming the glob top coating 7, a fluxing, solder ball attach, and reflow process can be performed. As a result, solder balls 8 are attached to the substrate, and are in contact with the dam structure 2(a). A package 100 is thereafter formed. If the package 100 is in an array of packages, then additional processes that can be performed include saw singulation, test, mark, and TNR.

FIG. 4(f) shows a side cross-section view of the package 100 shown in FIG. 4(e). For simplicity of illustration, the wirebonds 5 are not shown in FIG. 4(f).

FIG. 5(a) shows a top plan view of a leadframe 1 according to another embodiment of the invention. Like the leadframe 1 shown in FIG. 3(a), there gaps 1(d) between first, second, third and fourth leadframe portions 1(g)-1 to 1(g)-4. Unlike the leadframe 1 in FIG. 5(a), in this embodiment, the leadframe 1 is not partially etched (e.g., half-etched) or at least the conductive pads upon which solder and/or devices will be placed are not formed by partial etching. As shown, the leadframe 1 can simply be formed by stamping, with or without etching.

A number of tie bars 1(i) are also shown in FIG. 5(a). The tie bars 1(i) can be used to join the leadframe 1 to other leadframes in an array of leadframes so that many packages can be produced in parallel.

FIG. 5(b) shows a top plan view of a premolded substrate 10 after molding. As shown, a molding compound 2 coats the leadframe 1. A first window 2(f) and a number of second windows 2(e) are formed in the molding compound 2 and expose conductive surfaces which will define first and second conductive pads 1(g)-1', 1(g)-2', 1(g)-3', 1(g)-4', 1(h). The first conductive pads 1(g)-1', 1(g)-2', 1(g)-3', 1(g)-4' can be used as device mounting pads or wire bonding pads. The second conductive pads 1(h) can be used as pads for connecting to conductive structures such as solder balls. In this example, the portion of the molding compound 2 which forms the first window 2(f) and the second windows 2(e) may form a dam structure 2(a) according to an embodiment of the invention.

FIG. 5(c) shows a side, cross-sectional view of the substrate shown in FIG. 5(b) along the line 5(b)-5(b) shown in FIG. 5(b). As shown in FIG. 5(c), the edges of the leadframe 1 can be coated with molding compound edge portions 2(h). The edge portions 2(h) provide the advantage of locking the molding compound 2 to the leadframe 1, thereby reducing the risk of separation between the molding compound 2 and the leadframe 1.

Figure 5E:
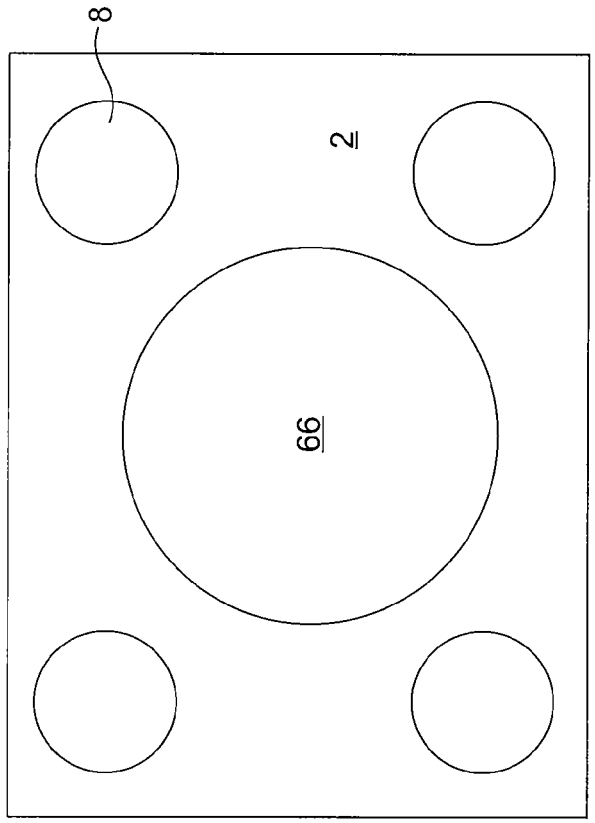
FIG. 5(e) shows a top view of the optical coupler package after solder structures are placed on the premolded substrate.
Figure 5F:
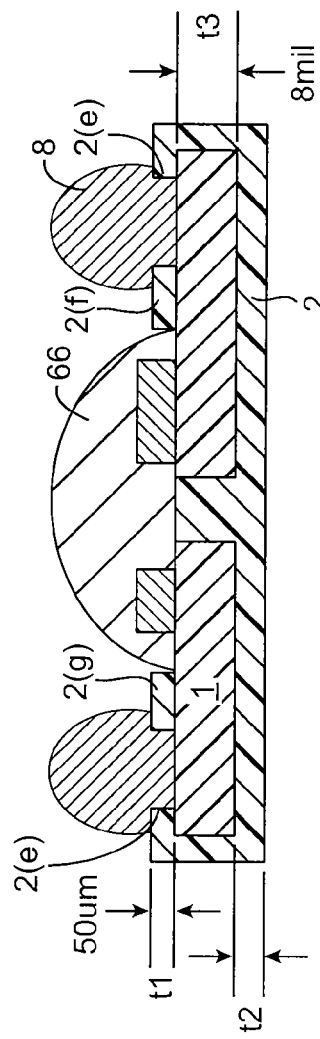
FIG. 5(f) shows a side, cross-sectional view of an optical coupler package according to an embodiment of the invention. The leadframe in the optical coupler package need not be partially etched.
Figure 5D:
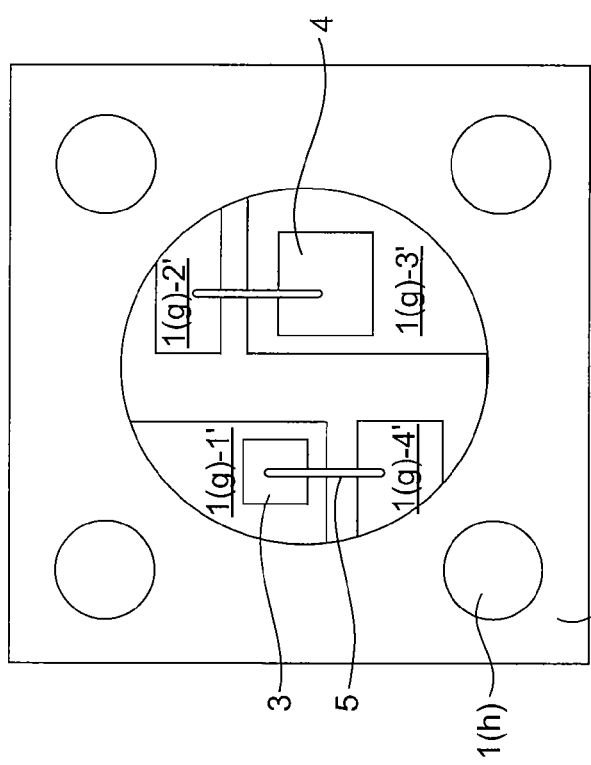
FIG. 5(d) shows a top view of an optical coupler package after devices are mounted and wirebonds are formed.

As shown in FIG. 5(d), a die attach process (as described above) can be used to attach the optical emitter device 3 and the optical receiver device 4 to conductive pads 1(g)-1' and 1(g)-3'. A wirebonding process (as described above) can also be used to form wirebonds between the optical emitter device 3 and the conductive pad 1(g)-4', and the optical receiver device 4 and the conductive pad 1(g)-2'.

As shown in FIGS. 5(e)-5(f), solder balls 8 can be deposited on the conductive pads 1(h) defined by the dam structure 2(a). As shown in FIG. 5(f), the solder balls may contact the inner edges of the dam structure 2(a) forming the second windows 2(e). A coupling gel and a glob top coating structure 66 (as described above) can thereafter be formed within the first window 2(f). The configuration of the dam structure 2(a) can prevent the coupling gel and the glob top coating in the structure 66 from reaching the solder balls 8 or the conductive pads 1(h) upon which the solder balls 8 rest.

Referring to FIG. 5(f), the leadframe 1 can have an exemplary thickness t3 of about 8 mils. A frontside coating thickness t1 forming the dam structure 2(a) can be about 50 microns, and a backside coating thickness t2 can be about 50 microns.

Figure 6A:
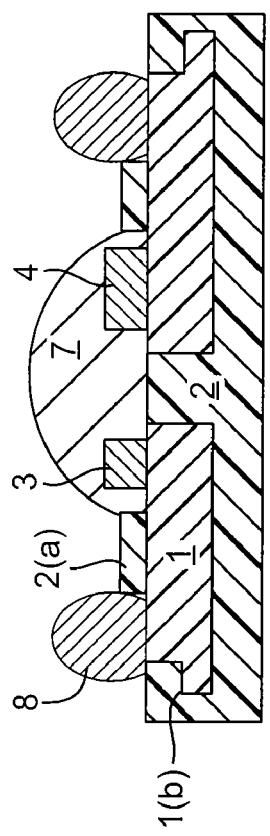

FIG. 6(a) shows an embodiment that is similar to the embodiment in FIG. 5(f) and like numerals designate like elements. However, in FIG. 6(a), the leadframe 1 includes a partially etched portion 1(b) at the outer edges of the leadframe 1. This can obviate the need for an outer dam structure support for the solder balls 8 As shown, the dam structure 2(a) can be configured so that only the inner portions of the solder balls 8 contact the dam structure 2(a) and there is no outer dam structure portion for the solder balls to contact.

Figure 6C:
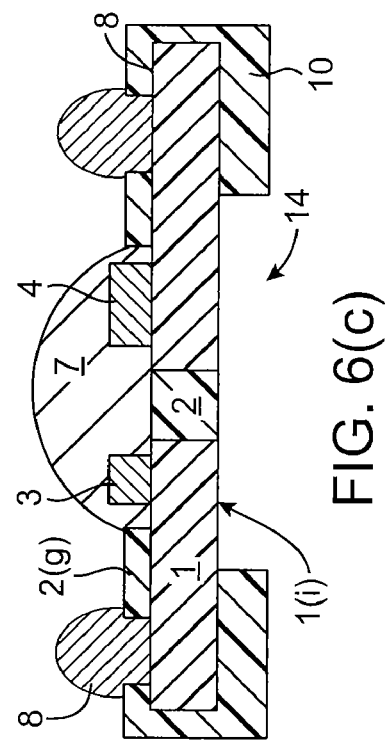
Figure 6B:
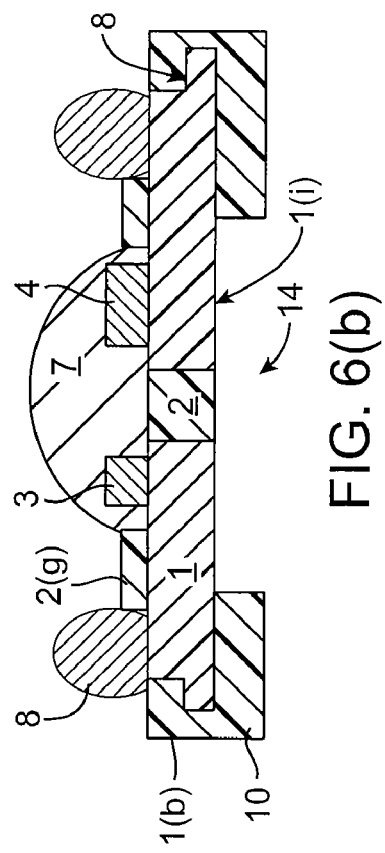

FIG. 6(b) shows another embodiment of the invention that is similar to the embodiment in FIG. 6(b), except that another window 14 is formed at the bottom of the substrate 10, to expose pads 1(i) on the surface of the substrate 10 opposite the optical emitter device 3 and the optical receiver device 4. The exposed pads 1(i) can serve to provide electrical connections to the leadframe 1, or the window 14 can be filled with a potting material.

FIG. 6(c) shows another embodiment of the invention that is similar to the embodiment in FIG. 5(f), except that it also includes a window 14 and exposed pads 1(i).

FIG. 6(d) shows an embodiment like the one shown in FIG. 6(b), except that a potting material 15 is present in the previously described window 14. The potting material 15 may comprise a material that is similar to the molding compound 2. Alternatively, the potting material 15 may comprise a material that has a higher thermal conductivity than the molding material 2, or equivalent dielectric strength as molding material 2.

FIG. 6(e) shows an embodiment like the one shown in FIG. 6(c), except that a potting material 15 is present in the previously described window 14. The potting material 15 may comprise a material that is similar to the molding compound 2. Alternatively, the potting material 15 may comprise a material that has a higher thermal conductivity than the molding material 2 or equivalent dielectric strength as the molding material 2.

FIG. 7(a) shows a backside perspective view of a substrate with a window 14 and exposed pads 1(i). A border 2(k) of molding compound defines the window 14. FIG. 7(b) shows the window 14 filled with a potting material 15. The illustrated package 100 is mounted on a circuit board 90 (circuit lines are not shown in the circuit board 90), and may for an electrical assembly 92.

Figure 8:
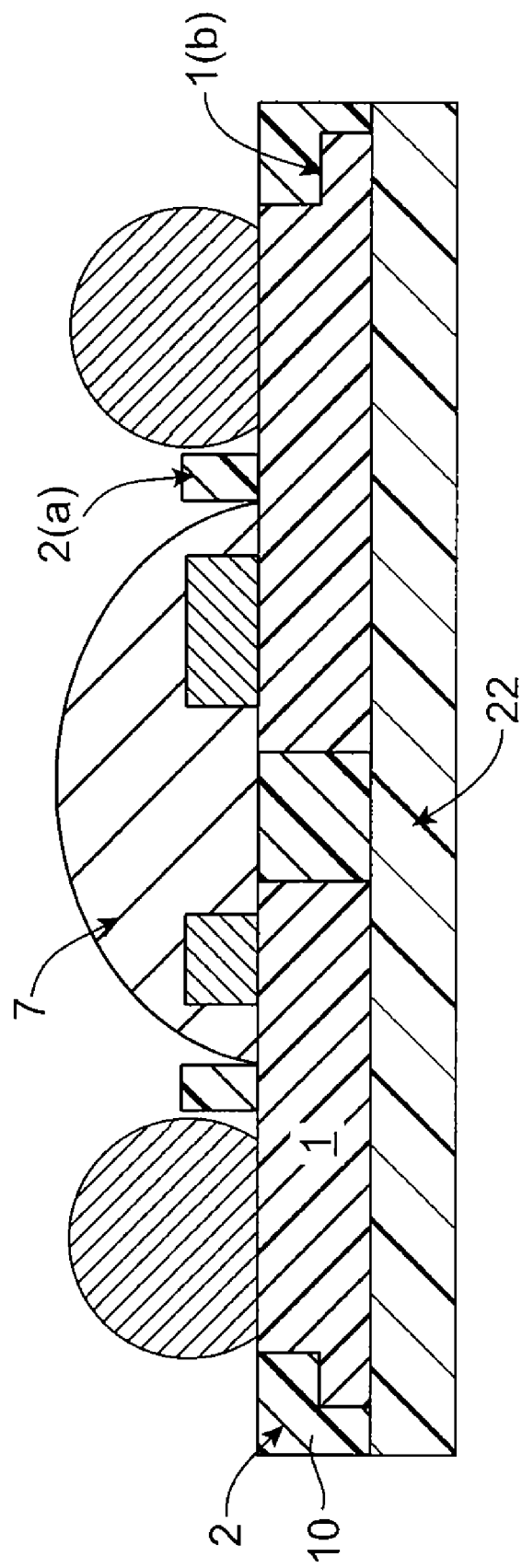
FIG. 8 shows a side, cross-sectional view of another optical coupler package.

FIG. 8 shows a side cross-section view of another embodiment of the invention. In this example, a coating material 22 coats the backside of a premolded substrate 10. Like the previously described potting material 15, the coating material can provide better thermal transfer properties than the previously described molding compound 2. As in prior embodiments, a dam structure 2(a) is provided on the leadframe 1. However, in some embodiments, the dam structure 2(a) is not necessary, and can be omitted from the package 100.

The above-described packages can be mounted on a substrate such as a circuit board to form an electrical assembly. Such electrical assemblies can be used in systems such as power supply systems, servers, etc.

Embodiments of the invention have a number of advantages. First, as noted above, some embodiments include premolded substrates that are overmolded on both the top and bottom sides. The substrates can be produced using molding dies so that cover tape is not needed to cover the leadframe. The reduces the risk of delamination, since adhesive from the tape would not contact the leadframe. Second, embodiments of the invention use a dam structure which prevents a glob top material from flowing to solder ball attach pads. Third, solder ball adhesion is improved since the dam structure serves as an anchor for the solder balls. Fourth, the thermal stress is balanced in the premolded substrates, since both sides of a leadframe can be coated with a molding material and/or a potting material. Also, coating both sides of a leadframe can reduce the change of warpage due to thermal mismatching during a reflow process. Fifth, embodiments of the invention allow for an exposed metal backside, which can be covered with a potting material if desired. Sixth, both stamped and etched leadframes can be used. Seventh, embodiments of the invention can use package sawing methods or punch type singulation methods.

It is noted that the present invention is not limited to the preferred embodiments described above, and it is apparent that variations and modifications by those skilled in the art can be performed within the spirit and scope of the present invention. Moreover, any one or more embodiment of the invention may be combined with one or more embodiments of the invention without departing from the spirit and scope of the invention. For example, although the packages described above have one optical emitter device, one optical receiver device, and less than 5 conductive structures (e.g., solder structures), embodiments of the invention may have more or less components than these.

Any references to top, bottom, etc. are intended to refer to positions of various components shown in the Figures and may or may not refer to absolute positions of such components in actual use.

Any recitation of "a", "an", and "the" is intended to mean "one or more" unless specifically indicated to the contrary.

What is claimed is:

1. A method comprising:
    forming a substrate comprising a leadframe, a molding compound, and a plurality of conductive pads disposed at a first surface of the substrate, wherein the molding compound fills internal spaces in the leadframe and forms a dam structure at the substrate's first surface that extends outward from the substrate's first surface, the dam structure being integral with at least a portion of the molding compound that fills the internal spaces in the leadframe;
    mounting an optical emitter on the substrate at the substrate's first surface;
    mounting an optical receiver on the substrate at the substrate's first surface; and
    forming an optically transmissive medium between the optical emitter and optical receiver.

2. The method of claim 1 wherein forming the substrate comprises:
    placing the leadframe in a molding tool with molding dies;
    providing a molding compound precursor between the molding dies; and
    solidifying the molding compound.

3. The method of claim 1 wherein the dam structure has a continuous inner edge.

4. The method of claim 1 further comprising wirebonding the optical emitter and the optical receiver to the leadframe in the substrate.

5. The method of claim 1 wherein the conductive pads are defined by windows recessed into the molding compound at the first surface of the substrate, and wherein the method further comprises:

depositing conductive structures on the conductive pads.

6. The method of claim 5 wherein the dam structure contacts and supports at least one of the conductive structures on the pads.

7. The method of claim 5 wherein the leadframe comprises copper.

8. The method of claim 5 wherein the conductive structures are solder balls, and wherein the solder balls have heights greater than the heights of the optical emitter device and the optical receiver device.

9. The method of claim 1 wherein a window recessed into the molding compound is formed at a second surface of the substrate, the second surface being opposite to the first surface, and wherein forming the substrate further comprises:
filling the window with a potting material.

10. The method of claim 1 further comprising:
forming a layer on an opposite side of the substrate that supports the optical emitter and optical receiver.

11. The method of claim 1 further comprising:
depositing solder structures on the substrate to form an optical coupler package;
flipping the optical coupler package over; and
mounting the optical coupler package to a circuit board.

12. An optical coupler package comprising:
a substrate comprising a leadframe, a molding compound, and a plurality of conductive pads disposed at a first surface of the substrate, wherein the molding compound fills gaps in the leadframe and forms a dam structure at the substrate's first surface that extends outward from the substrate's first surface, the dam structure being integral with at least a portion of the molding compound that fills the gaps in the leadframe;
an optical emitter on the substrate at the substrate's first surface;
an optical receiver on the substrate at the substrate's first surface, wherein the optical emitter and the optical receiver are electrically coupled to the leadframe; and
an optically transmissive medium disposed between the optical emitter and optical receiver.

13. The optical coupler package of claim 12 further comprising:
a plurality of conductive structures on the substrate, wherein the conductive structures on the substrate have heights greater than the heights of the optical emitter and optical receiver.

14. The optical coupler package of claim 13 wherein the conductive structures are solder balls.

15. The optical coupler package of claim 12, further comprising:
a window recessed into the molding compound at a second surface of the substrate, the second surface being opposite to the first surface; and
a potting material disposed in the window.

16. The optical coupler package of claim 12 further comprising wirebonds coupling the optical emitter and the optical receiver to the leadframe in the substrate.

17. The optical coupler package of claim 12 further comprising a reflective coating on the optically transmissive medium.

18. An electrical assembly comprising:
a circuit board; and
the optical coupler package of claim 13 mounted to the circuit board.

19. A system comprising the electrical assembly of claim 18.

20. An optical coupler package comprising:
a substrate comprising a leadframe and a molding compound, wherein the molding compound fills gaps in the leadframe, and a dam structure defining a device mounting area;
an optical emitter on the substrate;
an optical receiver on the substrate, wherein the optical emitter and the optical receiver are electrically coupled to the leadframe;
an optically transmissive medium disposed between the optical emitter and optical receiver; and
a plurality of conductive structures, wherein the conductive structures contact the dam structure.

21. The optical coupler package of claim 20 wherein the conductive structures are solder balls.

22. The optical coupler package of claim 20 further comprising wirebonds coupling the optical emitter device and the optical receiver device to the leadframe.

23. An electrical assembly comprising:
a circuit board; and
the optical coupler package of claim 20 mounted to the circuit board.

24. A system comprising the electrical assembly of claim 23.

* * * * *